United States Patent
Nomura et al.

(10) Patent No.: US 8,059,692 B2
(45) Date of Patent: Nov. 15, 2011

(54) LASER OSCILLATOR

(75) Inventors: Ryoji Nomura, Yamato (JP); Akihisa Shimomura, Atsugi (JP)

(73) Assignee: Semiconductor Energy Labortory Co., Ltd., Atsugi-shi, Kanagawa-ken (JP)

( * ) Notice: Subject to any disclaimer, the term of this patent is extended or adjusted under 35 U.S.C. 154(b) by 160 days.

(21) Appl. No.: 12/388,585

(22) Filed: Feb. 19, 2009

(65) Prior Publication Data

US 2009/0185584 A1    Jul. 23, 2009

Related U.S. Application Data

(63) Continuation of application No. 10/935,178, filed on Sep. 8, 2004, now Pat. No. 7,502,392.

(30) Foreign Application Priority Data

Sep. 12, 2003  (JP) ................................. 2003-322287

(51) Int. Cl.
    *H01S 3/08*    (2006.01)
(52) U.S. Cl. .......................................... 372/92; 372/98
(58) Field of Classification Search .................. 257/103; 428/690; 385/93
    See application file for complete search history.

(56) References Cited

U.S. PATENT DOCUMENTS

| | | | |
|---|---|---|---|
| 5,175,783 A | 12/1992 | Tatoh | |
| 5,623,181 A * | 4/1997 | Suehiro et al. | 313/512 |
| 5,834,893 A | 11/1998 | Bulovic et al. | |
| 6,069,440 A * | 5/2000 | Shimizu et al. | 313/486 |
| 6,091,195 A | 7/2000 | Forrest et al. | |
| 6,630,684 B2 | 10/2003 | Lee et al. | |
| 6,631,147 B2 | 10/2003 | Taniguchi et al. | |
| 6,641,287 B2 * | 11/2003 | Suehiro | 362/298 |
| 6,727,643 B2 * | 4/2004 | Suehiro | 313/499 |
| 6,829,023 B2 | 12/2004 | Goto | |
| 6,909,124 B2 | 6/2005 | Murakami | |
| 6,936,846 B2 | 8/2005 | Koyama et al. | |
| 7,192,659 B2 * | 3/2007 | Ricks et al. | 428/690 |

(Continued)

FOREIGN PATENT DOCUMENTS

EP    0450560 A    10/1991

(Continued)

OTHER PUBLICATIONS

Tessler, Lasers Based on Semiconducting Organic Materials, Adv. Mater., vol. 11, No. 5, 1999, pp. 363-370.

*Primary Examiner* — Jessica Stultz
*Assistant Examiner* — Tuan N Nguyen
(74) *Attorney, Agent, or Firm* — Eric J. Robinson; Robinson Intellectual Property Law Office, P.C.

(57) ABSTRACT

The present invention provides a laser oscillator using an electroluminescent material that can enhance directivity of emitted laser light and resistance to a physical impact. The laser oscillator has a first layer including a concave portion, a second layer formed over the first layer to cover the concave portion, and a light emitting element formed over the second layer to overlap the concave portion, wherein the second layer is planarized, an axis of laser light obtained from the light emitting element intersects with a planarized surface of the second layer, the first layer has a curved surface in the concave portion, and a refractive index of the first layer is lower than that of the second layer.

14 Claims, 14 Drawing Sheets

U.S. PATENT DOCUMENTS

| | | |
|---|---|---|
| 7,214,116 B2 | 5/2007 | Takekuma |
| 7,230,280 B2 * | 6/2007 | Yaw et al. .................. 257/98 |
| 7,260,135 B2 | 8/2007 | Shimomura et al. |
| 7,317,438 B2 | 1/2008 | Yamazaki et al. |
| 7,420,203 B2 * | 9/2008 | Tsutsui et al. .................. 257/40 |
| 7,449,724 B2 | 11/2008 | Yamazaki et al. |
| 7,462,883 B2 * | 12/2008 | Kumaki et al. .............. 257/103 |
| 7,473,923 B2 * | 1/2009 | Tsutsui et al. .................. 257/40 |
| 7,633,093 B2 * | 12/2009 | Blonder et al. ................ 257/81 |
| 2001/0051207 A1 | 12/2001 | Yamagata et al. |
| 2004/0140765 A1 * | 7/2004 | Takekuma .................... 313/512 |

FOREIGN PATENT DOCUMENTS

| | | |
|---|---|---|
| JP | 03-288479 A | 12/1991 |
| JP | 09-190883 | 7/1997 |
| JP | 11-045453 | 2/1999 |
| JP | 2000-156536 | 6/2000 |
| JP | 2002-026452 A | 1/2002 |
| JP | 2002-208491 | 7/2002 |
| JP | 2003-017273 | 1/2003 |

* cited by examiner

LASER OSCILLATOR

BACKGROUND OF THE INVENTION

1. Field of the Invention

The present invention relates to a laser oscillator using an electroluminescent material that can emit laser light.

2. Description of the Related Art

A semiconductor laser has a merit that a laser oscillator can be miniaturized and reduced in weight drastically, as compared with a gas or solid-state laser. Thus, a semiconductor laser comes into practical use in various fields, as a light-source for receiving and transmitting a signal by an optical interconnection in an optical integrated circuit, a light-source for recording in a recording medium such as an optical disk or an optical memory, and a light-source for optical communications using fiber-optics or the like as a light guide. The oscillation wavelength of a semiconductor laser has a wide range of from the blue wavelength to the infrared wavelength. Many semiconductor lasers that are used generally have their oscillation wavelengths in an infrared region, for example, the wavelength of a GaAs laser is 0.84 µm, the wavelength of an InAs laser is 3.11 µm, the wavelength of an InSb laser is 5.2 µm, the wavelength of a GaAlAs laser is 0.72 to 0.9 µm, and the wavelength of an InGaAsP laser is 1.0 to 1.7 µm.

In recent years, many researches on a practical use of a semiconductor laser having the oscillation wavelength in a visible region have been made. Depending on the trend, a laser oscillator that can emit laser light by using an electroluminescent material that can produce electroluminescence by being applied with an electric field (an organic semiconductor laser) has attracted more attentions. An organic semiconductor laser is expected to have a variety of use, since the organic semiconductor laser can emit laser light whose wavelength is in a visible region and it can be formed over an inexpensive glass substrate.

Reference 1 describes an organic semiconductor laser of which peak wavelength λ is 510 nm (Reference 1: Japanese Patent Laid Open No. 2000-156536. p. 11).

Laser light emitted from an organic semiconductor laser is generally lower in the directivity and tend to diffuse than other lasers. When the directivity of laser light is low, receiving and transmitting a signal in an optical interconnection becomes unstable due to disclination, and thus, high integration of an optical integrated circuit is prevented, which is not preferable. When divergence of laser light is large, it is difficult to assure the energy density of the laser light. A desired energy density can be assured by enhancing the intensity of laser light emitted from a light-source or by shortening the distance between a light-source of laser light and a predetermined region. However, the former has a demerit of increasing power consumption and the latter has a demerit of limits on use of the organic semiconductor laser.

The directivity of laser light can be enhanced by providing an optical system prepared separately for an organic semiconductor laser that is a light-source. However, as the optical system is more complicated, an adjustment of the optical system in maintenance or positioning of the optical system and the organic semiconductor laser is more troublesome. Further, resistance to a physical impact also becomes worse.

SUMMARY OF THE INVENTION

In view of the above mentioned problems, it is an object of the present invention to provide a laser oscillator using an electroluminescent material that can enhance directivity of emitted laser light and resistance to a physical impact.

The present inventors have conceived that directivity of laser light obtained by a light-emitting element can be enhanced by giving a function as an optical system to a substrate supporting the light-emitting element using an electroluminescent material, a layer such as a base film or a layer covering the light-emitting element.

Specifically, a laser oscillator of the present invention has a first layer including a concave portion, a second layer formed over the first layer to cover the concave portion, and a light emitting element formed over the second layer to overlap the concave portion, wherein the second layer is planarized, an axis of laser light obtained from the light emitting element intersects with a planarized surface of the second layer, the first layer has a curved surface in the concave portion, and a refractive index of the first layer is lower than that of the second layer.

The light-emitting element includes a first electrode (an anode), a second electrode (a cathode) and a light emitting layer provided between the two electrodes, and an electroluminescent material included in the light emitting layer functions as a laser medium according to the present invention. Note that a hole injecting layer, a hole transporting layer or the like between the light emitting layer and the anode, and an electron injecting layer, an electron transporting layer or the like between the light emitting layer and the cathode, may be provided, respectively. In this case, all layers that are provided between the anode and the cathode are referred to as an electroluminescent layer, in which a light emitting layer is also included therein. In some cases, an inorganic compound is included in a layer for forming the electroluminescent layer.

In addition, an optical resonator of the laser oscillator of the present invention is a plane-parallel type, for which two reflectors having a plane for reflecting and oscillating light are used. Specifically, a part of the first electrode and the second electrode is used as the reflector to form the optical resonator. However, a part of the first electrode and the second electrode is not necessarily used as the reflector for forming the optical resonator. For example, a film formed separately to reflect light (reflective film) may be employed as the reflector. Alternatively, light generated in the light emitting layer may be reflected from a layer other than the light emitting layer, for example, a hole injecting layer, a hole transporting layer, an electron injecting layer, an electron transporting layer or the like, to form an optical resonator.

In addition, the laser oscillator of the present invention does not necessarily require the first layer having the concave portion. For example, the laser oscillator may have a light emitting element formed over the first layer, a second layer formed to cover the light emitting element, in which the second layer may have a convex portion to overlap with the light emitting element, a light axis of laser light obtained from the light emitting element may intersect with the second layer, and the second layer may have a curved surface in the convex portion.

Further, a concave portion and a convex portion may be formed to face each other with the light emitting element therebetween. In any case, the concave portion and the convex portion each have their center of curvature on the light emitting element side.

In the present invention, directivity of laser light emitted from an optical resonator can be enhanced by a concave portion included in a layer for supporting a light emitting element or a convex portion included in a layer covering a light emitting element. Further, troublesome steps such as an adjustment of an optical system in maintenance or positioning of the optical system and an organic semiconductor laser can be prevented and the resistance to a physical impact can be enhanced since one part of the layer functions as an optical system, which is different from the case of providing an optical system separately.

These and other objects, features and advantages of the present invention become more apparent upon reading of the following detailed description along with the accompanying drawings.

DETAILED DESCRIPTION OF THE INVENTION

Embodiment Mode

Figure 1A:
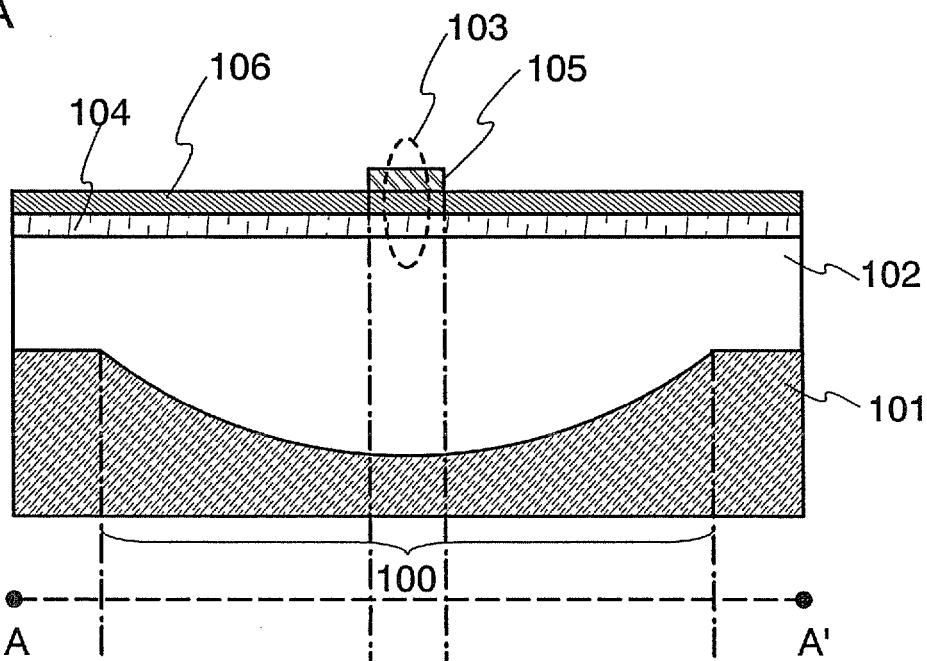
FIGS. 1A and 1B are a cross-sectional view and a top view of a laser oscillator, respectively according to one aspect of the present invention.
Figure 1B:
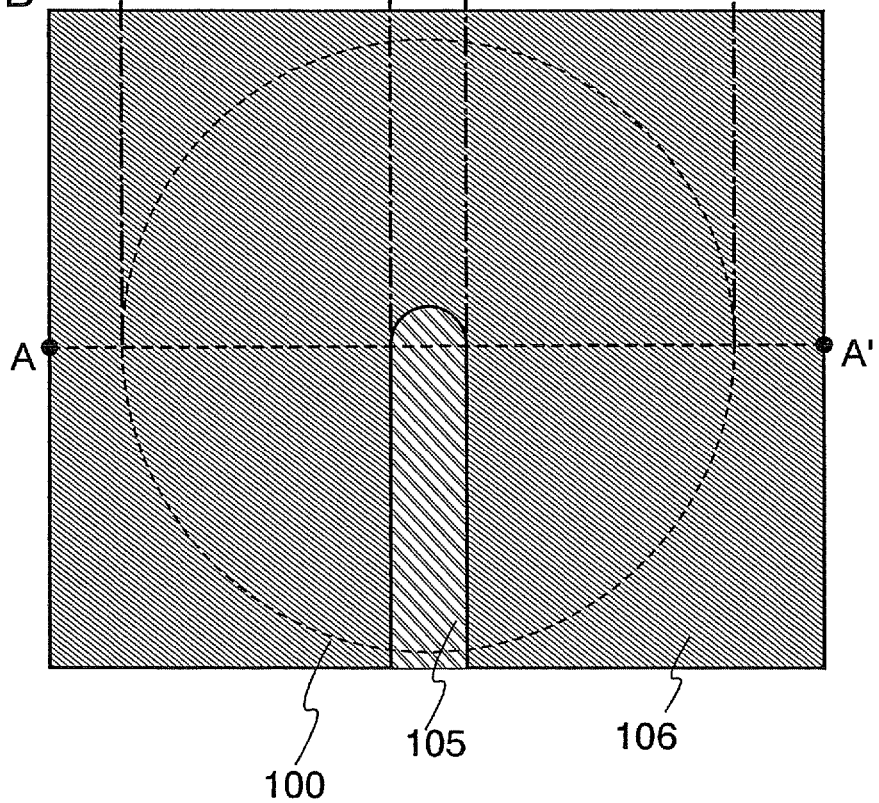

One mode of a laser oscillator of the present invention is explained with reference to FIGS. 1A and 1B. FIG. 1A is a cross-sectional view of the laser oscillator of the present invention. FIG. 1B is a top view of the laser oscillator of the present invention shown in FIG. 1A. FIG. 1A is a cross-sectional view taken along the line A-A' of FIG. 1B. As shown in FIGS. 1A and 1B, the laser oscillator of the present invention includes a first layer 101 having a concave portion 100, and a second layer 102 formed over the first layer 101 to cover the concave portion 100. The second layer 102 is formed to have a thickness enough to fill the concave portion 100. The refractive index of the first layer 101 is lower than that of the second layer 102. The second layer 102 is light-transmitting.

FIG. 1A shows an example that each of the first layer 101 and the second layer 102 is formed from one layer. Alternatively, each of these layers may be formed from a plurality of layers. In this case, a layer of the first layer 101 that is closest to the second layer 102 is formed to have lower refractive index than that of a layer of the second layer 102 that is closest to the first layer 101.

As shown in FIGS. 1A and 1B, a light-emitting element 103 is formed over the second layer 102 to overlap the concave portion 100. The light-emitting element 103 includes two electrodes 104 and 105, and an electroluminescent layer 106 interposed between these electrodes 104 and 105. One of the electrodes 104 and 105 is an anode, and the other is a cathode. FIGS. 1A and 1B show an example that the electrode 104 serves as an anode, and the electrode 105 serves as a cathode. Alternatively, the electrode 104 may serve as a cathode, and the electrode 105 may serve as an anode. Current is supplied to the electroluminescent layer 106 by applying a forward bias voltage to the electrodes 104 and 105, thereby making the electroluminescent layer 106 emit light.

The first layer 101 has a curved surface in the concave portion 100. The center of curvature of the curved surface is on the light emitting element 103 side, that is, a distance of the first layer 101 to the center of curvature is longer than that of the first layer 101 to the light emitting element 103.

In the laser oscillator shown in FIGS. 1A and 1B, an optical resonator is formed by the electrodes 104 and 105 included in the light-emitting element 103. Light generated in the electroluminescent layer 106 is oscillated by the electrodes 104 and 105, and is emitted as laser light. In the optical resonator, an optical axis of the emitted laser light intersects with the second layer 102 and the emitted laser light is directed to the first layer 101.

Figure 2:
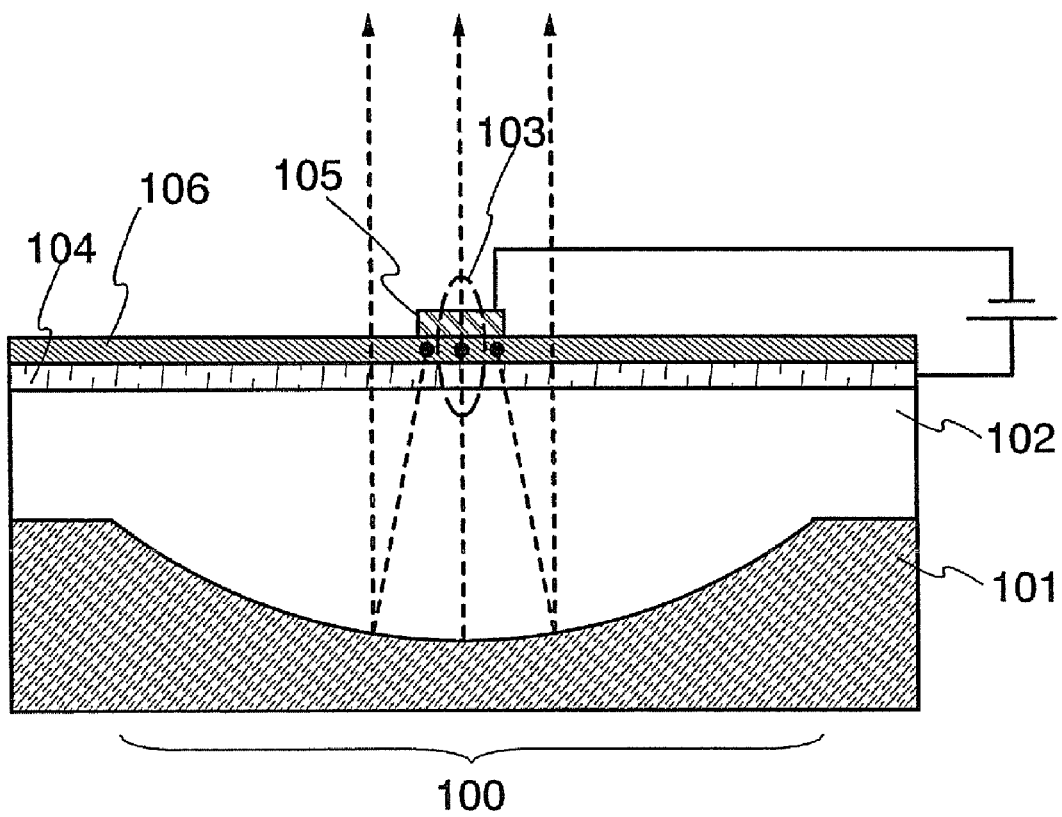
FIG. 2 is a cross-sectional view of a laser oscillator according to one aspect of the present invention.

FIG. 2 shows the laser oscillator shown in FIGS. 1A and 1B, in which a forward bias voltage is applied to the electrodes 104 and 105. As shown by the arrows of broken lines, laser light is emitted toward the concave portion 100 of the first layer 101 from the electrode 104 side by applying voltage to the electrodes 104 and 105. The emitted laser light diverges to some extent, but the directivity is enhanced while suppressing the divergence angle by reflecting and converging the laser light in the concave portion 100. The focus length of the concave portion 100 may be optically designed in accordance with the divergence angle of laser light emitted to the concave portion 100 so as to suppress the divergence angle.

The mode of enhancing the directivity of laser light by reflecting and converging the emitted laser light in the concave portion is described in FIGS. 1A and 1B, and FIG. 2. However, the directivity of laser light may be enhanced by refracting and converging the light in the convex portion. A mode of a laser oscillator of the present invention that can enhance the directivity of laser light by refracting and converging the light in the convex portion is described with reference to FIGS. 3A and 3B.

Figure 3A:
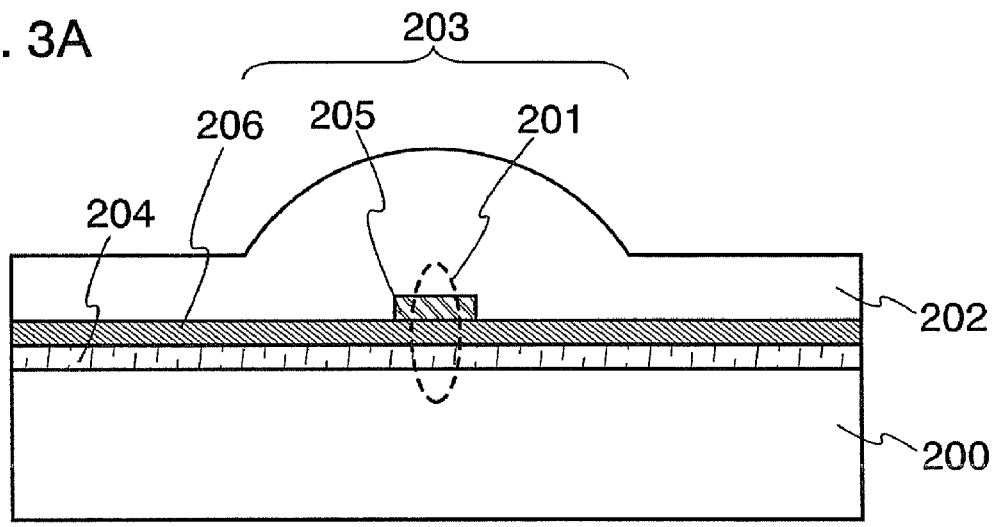
FIGS. 3A and 3B are cross-sectional views of a laser oscillator according to one aspect of the present invention.

FIG. 3A is a cross-sectional view of a laser oscillator of the present invention. The laser oscillator of the present invention includes a first layer 200, a light emitting element 201 formed over the first layer 200, and a second layer 202 formed to cover the light emitting element 201, as shown in FIG. 3A. The second layer 202 is light-transmitting and have a convex portion 203 to overlap the light emitting element 201.

FIG. 3A shows an example in which the first layer 200 and the second layer 202 are each formed from one layer, but they may be each formed from plural layers.

The second layer 202 has a curved surface in the convex portion 203. The center of curvature of the curved surface is on the light emitting element 201 side, that is, a distance of the second layer 202 to the center of curvature is longer than that of the second layer 202 to the light emitting element 201.

Figure 3B:
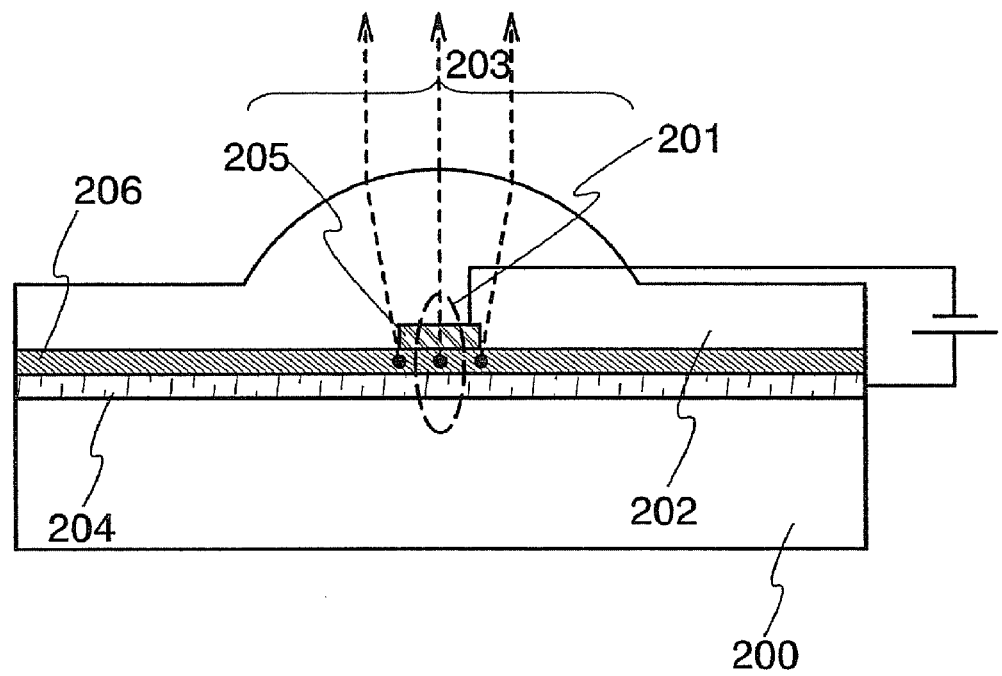

The light-emitting element 201 has two electrodes 204 and 205 and an electroluminescent layer 206 interposed between the two electrodes 204 and 205. Note that one electrode of the electrodes 204 and 205 is an anode and the other is a cathode. FIGS. 3A and 3B each show an example in which the electrode 204 is an anode and the electrode 205 is a cathode, but the electrode 204 may be a cathode and the electrode 205 may be an anode. Current is supplied to the electroluminescent layer 206 by applying a forward bias voltage to the electrodes 204 and 205, thereby making the electroluminescent layer 206 emit light.

In the laser oscillator shown in FIG. 3A, an optical resonator is formed by the electrodes 204 and 205 included in the light-emitting element 201, like the laser oscillator shown in FIGS. 1A and 1B. The light emitted from the electroluminescent layer 206 is oscillated by the electrodes 204 and 205 to be emitted as laser light. The optical resonator is formed in such a way that the optical axis of the emitted laser light intersects with the second layer 202 and the emitted laser light is directed to the second layer 202.

FIG. 3B shows a mode that a forward bias voltage is applied to the electrodes 204 and 205 in the laser oscillator shown in FIG. 3A. As shown by the arrows of broken lines, laser light is emitted toward the convex portion 203 of the second layer 202 from the electrode 205 side by applying voltage to the electrodes 204 and 205. The emitted laser light diverges to some extent, but the directivity is enhanced while suppressing the divergence angle by refracting and converging the laser light in the convex portion 203. The focus length of the convex portion 203 may be optically designed in accordance with the divergence angle of the laser light emitted to the convex portion 203 so as to suppress the divergence angle.

Moreover, a laser oscillator of the present invention may be formed so that a concave portion for reflecting and converging laser light faces a convex portion for refracting and converging laser light with a light-emitting element therebetween. A mode of the laser oscillator of the present invention, in which the concave portion faces the convex portion, is described with reference to FIGS. 4A and 4B.

Figure 4A:
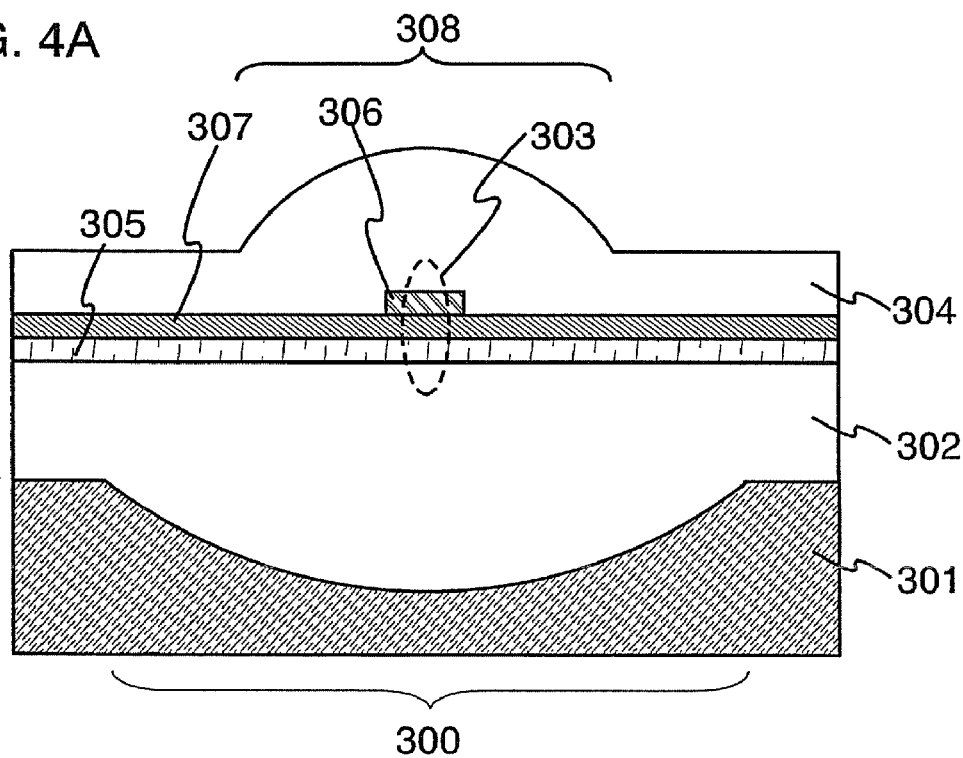
FIGS. 4A and 4B are cross-sectional views of a laser oscillator according to one aspect of the present invention.

FIG. 4A is a cross-sectional view of a laser oscillator of the present invention. As shown in FIG. 4A, the laser oscillator of the present invention includes a first layer 301 having a concave portion 300, and a second layer 302 formed over the first layer 301 to cover the concave portion 300. The second layer 302 is formed to have a thickness enough to fill the concave portion 300. The refractive index of the first layer 301 is lower than that of the second layer 302. The second layer 302 is light-transmitting.

FIG. 4A shows an example that each of the first layer 301 and the second layer 302 is formed from one layer. Alternatively, each of these layers may be formed from a plurality of layers. In this case, a layer of the first layer 301 that is closest to the second layer 302 is formed to have lower refractive index than that of a layer of the second layer 302 that is closest to the first layer 301.

As shown in FIG. 4A, a light-emitting element 303 is formed over the planarized second layer 302 to overlap the concave portion 300. A third layer 304 is formed to cover the light emitting element 303. The light-emitting element 303 includes two electrodes 305 and 306 and an electroluminescent layer 307 interposed between these electrodes 305 and 306. Note that one electrode of the electrodes 305 and 306 is an anode and the other is a cathode. FIG. 4A shows an example in which the electrode 305 is an anode and the electrode 306 is a cathode, but the electrode 305 may be a cathode and the electrode 306 may be an anode. Current is supplied to the electroluminescent layer 307 by applying a forward bias voltage to the electrodes 305 and 306, thereby making the electroluminescent layer 307 emit light.

The third layer 304 is light-transmitting, and have a convex portion 308 to overlap the light emitting element 303.

The first layer 301 has a curved surface in the concave portion 300. The center of curvature of the curved surface is on the light emitting element 303 side, that is, a distance of the first layer 301 to the center of curvature is longer than that of the first layer 301 to the light emitting element 303. The third layer 304 has a curved surface in the convex portion 308. The center of curvature of the curved surface is on the light emitting element 303 side, that is, a distance of the third layer 304 to the center of curvature is longer than that of the third layer 304 to the light emitting element 303.

FIG. 4A shows an example in which the third layer 304 is formed from one layer, but may be formed from plural layers.

In the laser oscillator shown in FIG. 4A, an optical resonator is formed by the electrodes 305 and 306 included in the light-emitting element 303. Light generated in the electroluminescent layer 307 is oscillated by the electrodes 305 and 306 to be emitted as laser light. In the optical resonator, an optical axis of the emitted laser light intersects with the second layer 302 and the emitted laser light is directed to the first layer 301.

Figure 4B:
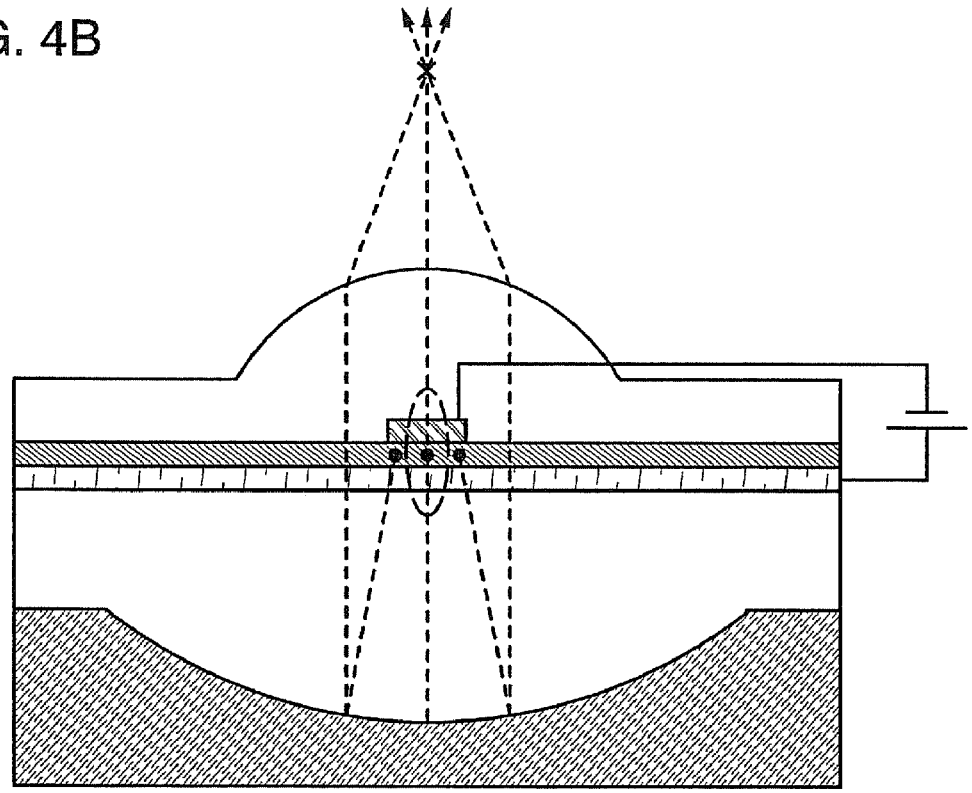

FIG. 4B shows the laser oscillator shown in FIG. 4A in which a forward bias voltage is applied to the electrodes 305 and 306. As shown by the arrows of broken lines, laser light is emitted toward the concave portion 300 of the first layer 301 from the electrode 305 side by applying voltage to the electrodes 305 and 306. The emitted laser light diverges to some extent, but the directivity is enhanced while suppressing the divergence angle by reflecting and converging the laser light in the concave portion 300. The focus length of the concave portion 300 may be optically designed in accordance with the divergence angle of laser light emitted to the concave portion 300 so as to suppress the divergence angle. In the laser oscillator shown in FIGS. 4A and 4B, the light reflected by the concave portion 300 can be converged in the convex portion 308 of the third layer 304.

Figure 11:
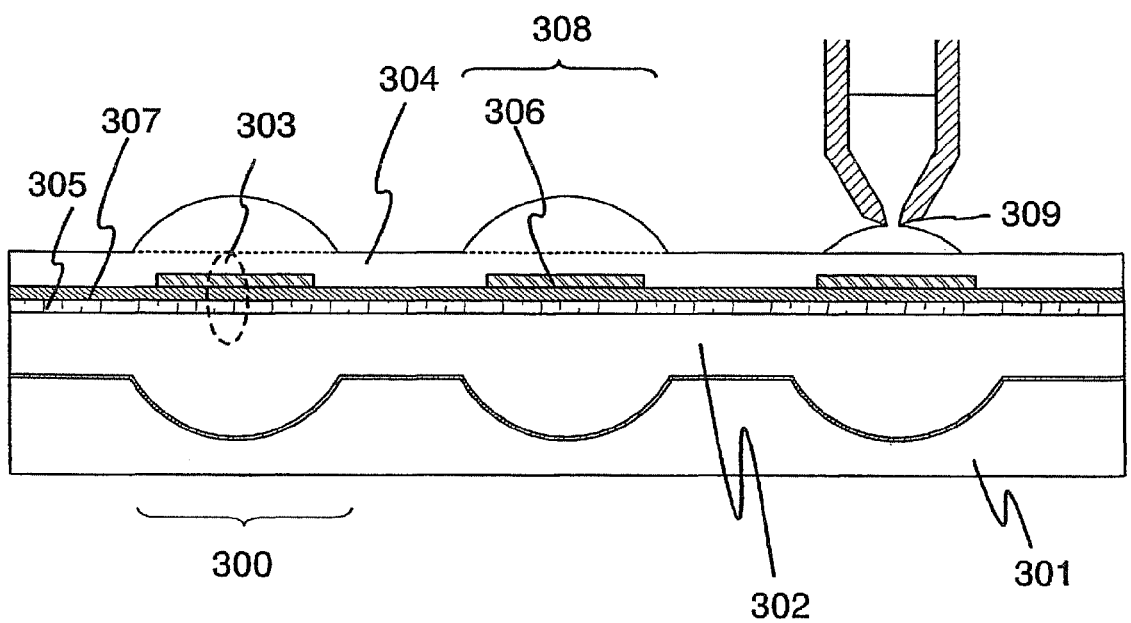
FIG. 11 shows an embodiment for a method for manufacturing a convex portion.

The convex portion 308 may be formed by a droplet discharging method as shown in FIG. 11 after forming the third layer 304. The reference numerals 300 to 308 shown in FIG. 11 are equivalent to those of FIGS. 4A and 4B. The reference numeral 309 denotes a nozzle of a droplet discharging apparatus. A material that is a polymeric (high molecular weight) material and is transparent to light to be used, particularly, visible light, and that a solid polymeric material heated at equal to or more than a melting point at a room temperature is preferably used as the material which can be employed in forming the convex portion 308. For example, poly(alkylacrylate), poly(alkylmethacrylate), polystyrene, polyethylene, polypropylene, polycarbonate, a derivative thereof, and the like can be used. In addition, a material formed by applying a monomer that is a raw material of the polymers and curing it by heating of light-irradiation may be used.

As mentioned earlier, the directivity of laser light emitted from an optical resonator can be enhanced by the concave portion included in the layer for supporting the light emitting element or the convex portion included in the layer covering the light emitting element, according to the present invention. Further, the resistance to a physical impact can be enhanced since one part of the layer functions as an optical system, which is different from the case of providing an optical system separately.

In the laser oscillator shown in FIGS. 1A, 1B, 2, 3A, 3B, 4A and 4B, light is oscillated between two electrodes included in the light emitting element, but the present invention is not limited thereto. Light may be oscillated by a reflective film prepared separately, or light generated in the light emitting layer may be reflected from a layer other than the light emitting layer, for example, a hole injecting layer, a hole transporting layer, an electron injecting layer, an electron transporting layer or the like, to form an optical resonator.

Embodiment 1

A structure of a light-emitting element used for a laser oscillator of the present invention is explained in Embodiment 1.

Figure 5:
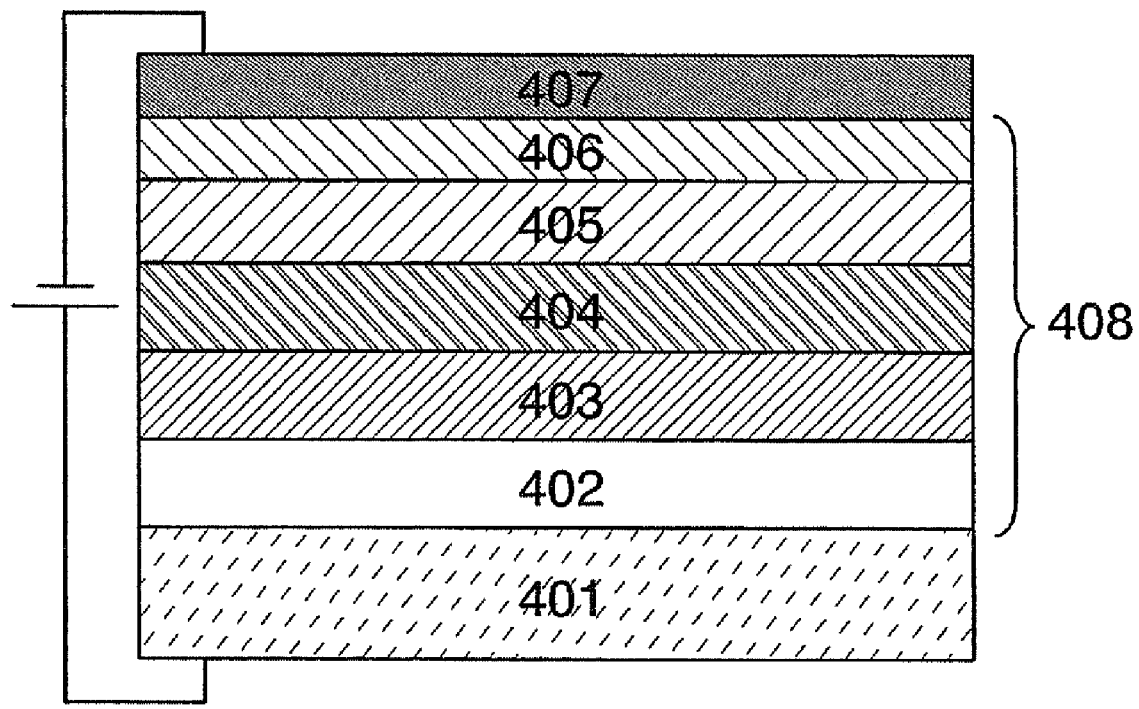
FIG. 5 shows a structure of a light-emitting element included in a laser oscillator according to one aspect of the present invention.

FIG. 5 shows one mode of a structure of a light-emitting element used in the present invention. A light-emitting element shown in FIG. 5 has a structure in which an electroluminescent layer 408 is included between an anode 401 and a cathode 407. The electroluminescent layer 408 is formed by sequentially stacking a hole injecting layer 402, a hole transporting layer 403, a light-emitting layer 404, an electron transporting layer 405, and an electron injecting layer 406 over the anode 401.

A light-emitting element used for a laser oscillator of the present invention may include at least a light-emitting layer within an electroluminescent layer. Layers having properties other than light emission (a hole injecting layer, a hole transporting layer, an electron transporting layer, and an electron injecting layer) can be combined appropriately. Although not limited to the materials recited herein, the above-mentioned layers are each formed by the following materials.

As the anode 401, a conductive material having a large work function is preferably used. In the case that light is passed through the anode 401, a material having favorable light-transmitting properties is used for the anode 401. In this instance, a transparent conductive material such as an indium tin oxide (ITO), an indium zinc oxide (IZO), or an indium tin oxide containing silicon oxide (ITSO) may be used. In the case where the anode 401 is used as a reflector, a material that has light-reflecting properties is used for the anode 401. For example, structures which are shown as follows can be used: a single layer of comprising one or plurality of elements selected from TiN, ZrN, Ti, W, Ni, Pt, Cr, Ag, or the like; a lamination layer of a film comprising titanium nitride film and a film mainly containing aluminum; and a lamination structure of a triple film having a titanium nitride film, a film comprising aluminum as its main component, and a film comprising titanium nitride. Alternatively, a lamination formed by stacking the transparent conductive material on such a material that can reflect light may be used as the anode 401.

As a hole injecting material for the hole injecting layer 402, a material that has comparative small ionization potential and small visible light absorption properties is preferably used. Such materials can be broadly divided into metal oxides, low molecular organic compounds, and high molecular organic compounds. Metal oxides such as a vanadium oxide, a molybdenum oxide, a ruthenium oxide, and an aluminum oxide can be used. Low molecular organic compounds such as starburst amine as typified by m-MTDATA, metallophthalocyanine as typified by copper phthalocyanine (Cu—Pc), phthalocyanine ($H_2$—Pc), and 2,3-dioxyethylenethiopehen derivatives can be used. The hole injecting layer 402 may be formed by co-evaporation of the low molecular organic compound and the metal oxide. High molecular organic compounds such as polyaniline (PAni), polyvinyl carbazole (PVK), and polythiophene derivatives can be used. Polyethylenedioxythiophene (PEDOT), which is one of polythiophene derivatives, doped with polystyrene sulfonate (PSS) can be used.

As a hole transporting material for the hole transporting layer 403, a known material that has favorable hole transporting properties and low crystallinity can be used. Aromatic amine (namely, a compound having a benzene ring-nitrogen bond) based compounds are preferably used. For example, 4,4-bis[N-(3-methylphenyl) -N-phenylamino]-biphenyl (TPD), and derivatives thereof such as 4,4'-bis[N-(1-naphthyl)-N-phenyl-amino]-biphenyl (α-NPB) etc., are cited. Star burst aromatic amine compounds such as 4,4',4"-tris(N,N-diphenylamino)-triphenyl amine (TDATA), and MTDATA can be also used. Alternatively, 4,4',4"-tris(N-carbazolyl) triphenylamine (TCTA) may be used. As a high molecular material, poly(vinylcarbazole) having favorable hole transporting properties can be used. Further, inorganic substances such as $MoO_x$ can be used.

A known material can be used for the light-emitting layer 404. For example, metal complexes such as tris(8-quinolinolate)aluminum ($Alq_3$), tris(4-methyl-8-quinolinolate)aluminum ($Almq_3$), bis(10-hydroxybenzo[η]-quinolinato)beryllium ($BeBq_2$), bis(2-methyl-8-quinolinolato)-(4-hydroxy-biphenylyl)-aluminum (BAlq), bis[2-(2-hydroxyphenyl)-benzooxazolate]zinc ($Zn(BOX)_2$), or bis[2-(2-hydroxyphenyl)-benzothiazolate]zinc ($Zn(BTZ)_2$) can be used. Various fluorescent dyes (coumarin derivatives, quinacridone derivatives, rubrene, 4,4-dicyanomethylene, 1-pyron derivatives, stilbene derivatives, various condensation aromatic compounds, or the like) can be also used. Phosphorescent materials such as platinum octaethylporphyrin complexes, tris(phenylpyridine)iridium complexes, and tris (benzylideneacetonato)phenanthrene europium complexes can be used. Especially, phosphorescent materials have longer excitation time than fluorescent materials, and thus the phosphorescent materials can make easily population inversion that is indispensable to laser oscillation, that is, the state where the number of molecules in an excited state is larger than that in a ground state. The foregoing materials can be used as a dopant or a single layer film.

As a host material for the light-emitting layer 404, a hole transporting material or an electron transporting material as typified by the foregoing examples can be used. A bipolar material such as 4,4'-N,N'-dicarbazolyl-biphenyl (CBP) can be also used.

As an electron transporting material for the electron transporting layer 405, metal complexes as typified by $Alq_3$ having a quinoline skeleton or a benzoquinoline skeleton, the mixed ligand complexes or the like can be used. Specifically, metal complexes such as $Alq_3$, $Almq_3$, $BeBq_2$, BAlq, $Zn(BOX)_2$, or $Zn(BTZ)_2$ can be cited. Alternatively, oxadiazole derivatives such as 2-(4-biphenylyl)-5-(4-tert-butylphenyl)-1,3,4-oxadiazole (PBD), or 1,3-bis[5-(p-tert-butylphenyl)-1,3,4-oxadiazole-2-yl]benzene (OXD-7); triazole derivatives such as 3-(4-tert-butylphenyl)-4-phenyl-5-(4-biphenylyl)-1,2,4-triazole (TAZ), or 3-(4-tert-butylphenyl)-4-(4-ethylphenyl)-5-(4-biphenylyl)-1,2,4-triazole (p-EtTAZ); imidazole derivatives such as TPBI; phenanthroline derivatives such as bathophenanthroline (BPhen); bathocuproin (BCP) in addition to metal complexes can be used.

As an electron injecting material for the electron injecting layer, the foregoing electron transporting material can be used. Besides, an ultra thin film of insulator, for example, alkali metal halides such as LiF or CsF, alkali earth metal halides such as $CaF_2$, alkali metal oxides such as $LiO_2$ is frequently used. Further, alkali metal complexes such as lithium acetylacetonate (Li(acac)) or 8-quinolinolato-lithium (Liq) can be effectively used.

For the cathode 407, metals, alloys, electric conductive compounds that each have a small work function, or a mixture thereof can be used. Specifically, alkali metals such as Li and Cs; alkali earth metals such as Mg, Ca, and Sr; an alloy including the elements (Mg:Ag, Al:Li, or the like); or rare earth metals such as Yb and Er can be used. In the case of using an electron injecting layer such as LiF, CsF, $CaF_2$, or $Li_2O$, a general conductive thin film such as aluminum can be used. In the case where light is passed through the cathode 407, the cathode 407 may be formed by a lamination of an ultra thin film containing alkali metals such as Li or Cs and alkali earth metals such as Mg, Ca, Sr; and a transparent conductive film (such as ITO, IZO, or ZnO). Alternatively, an electron injecting layer is formed by co-evaporation of an alkali metal or an alkali earth metal and an electron transporting material, and a transparent conductive film (such as ITO, IZO, or ZnO) may be laminated thereon to form the cathode 407.

An optical resonator is formed by two reflectors, one of which is formed to have as high reflectivity as possible and the other of which is formed to have a certain level of transmittance. Accordingly, laser light can be emitted from the reflector that has high transmittance. For example, in the case where the anode 401 and the cathode 407 are used as reflectors to emit laser light, these electrodes are formed by selecting materials or a thickness to have transmittance of approximately from 5 to 70%. Alternatively, in the case where a reflector is formed separately, the anode 401 or cathode 407 comprise such a material that the light is passed through.
the reflector is formed by such a material that light is passed through the anode 401 or the cathode 407.

The interval of the reflectors is an integral multiple of a half of the wavelength λ to be oscillated. A lamination structure of a light-emitting element is designed so that a phase of light reflected by a reflector and that of light newly generated are correspondent.

A method for laminating each layer of the above-mentioned light-emitting element of the present invention is not limited. If the light-emitting element can be formed by laminating layers, any method such as vacuum vapor deposition, spin coating, ink jetting, or dip coating can be utilized.

Embodiment 2

One mode of a laser oscillator including a plurality of light-emitting elements of the present invention is explained in Embodiment 2.

Figure 6A:
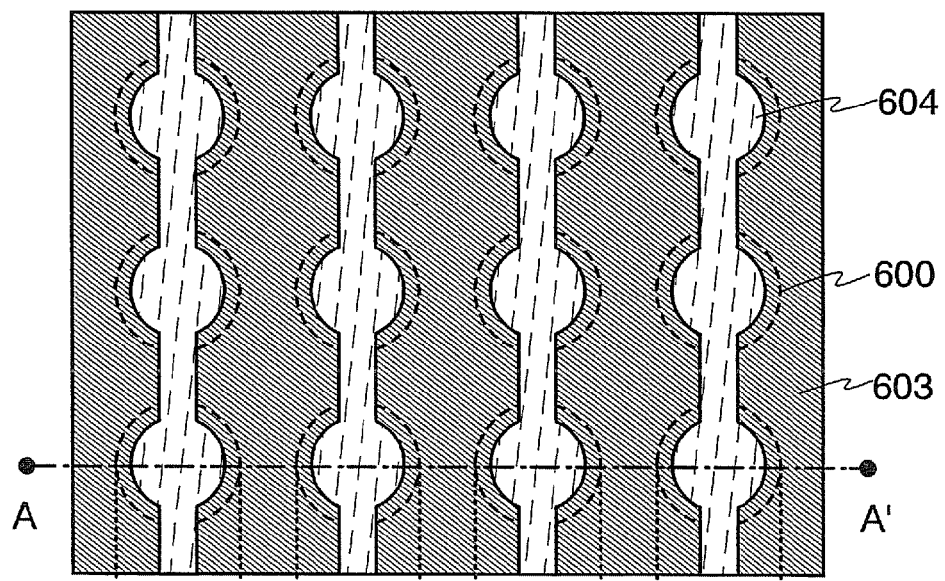
FIGS. 6A and 6B are a top view and a cross-sectional view in a process for manufacturing a laser oscillator, respectively according to one aspect of the present invention.
Figure 6B:
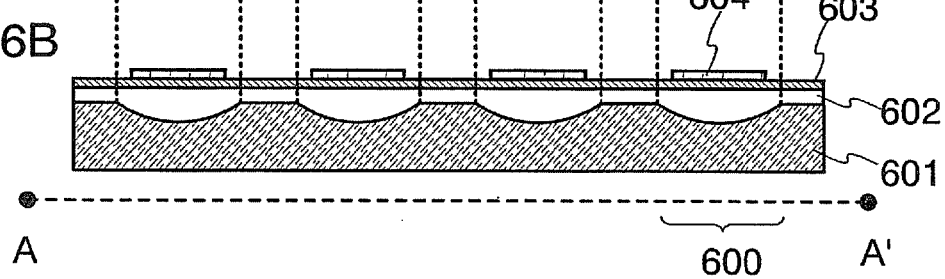

FIG. 6A is a top view of the laser oscillator in this embodiment when an anode of a light-emitting element is formed. FIG. 6B is a cross-sectional view taken along the line A-A' of FIG. 6A. In the laser oscillator in this embodiment, a second layer 602 is formed to fill plural concave portions 600 on a first layer 601 having the plural concave portions 600. A reflective film 603 to be used as a reflector is formed on the second layer 602. The reflective film 603 can reflect light emitted from a light emitting element and employ an insulating material. For example, insulating films having different refractive indexes, such as a silicon oxide, a silicon nitride, a titanium oxide may be alternately laminated to form a film, thereby using it as the reflective film 603.

An anode 604 is formed on the reflective film 603 to overlap the plural concave portions 600. The anode 604 is formed of a light-transmitting material. In FIGS. 6A and 6B, the anode 604 is light-transmitting, and the reflective film 603 is used as a reflector. However, this embodiment is not limited thereto. The anode 604 may be formed from a light-reflective material without providing the reflective film 603.

Figure 7A:
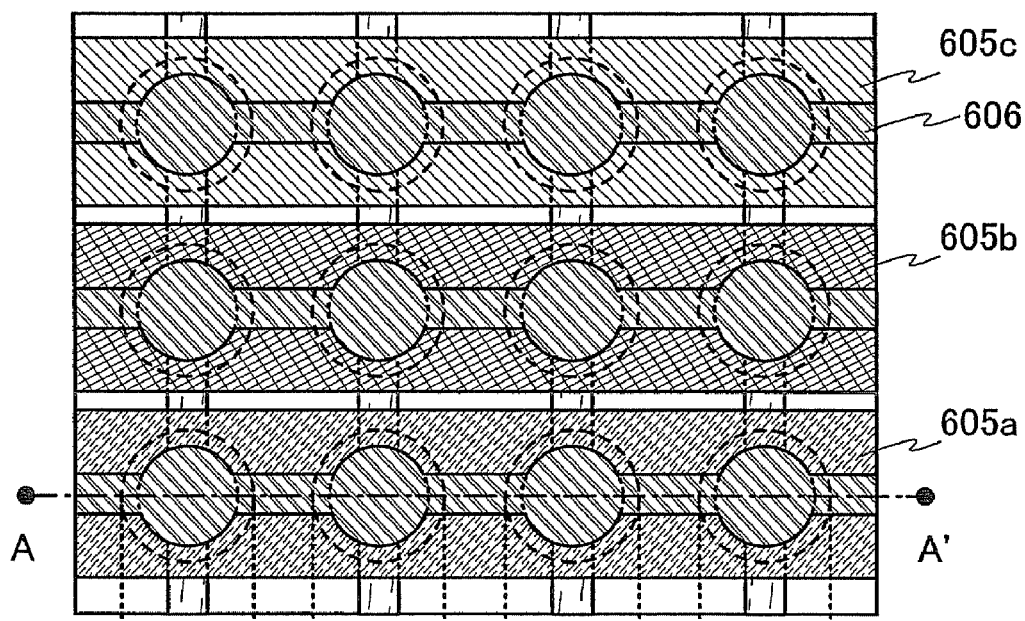
FIGS. 7A and 7B are a top view and a cross-sectional view of a laser oscillator, respectively according to one aspect of the present invention.
Figure 7B:
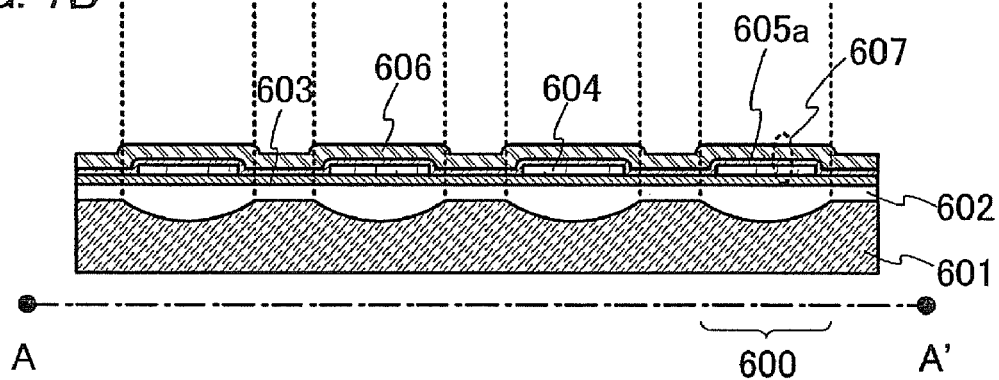

FIG. 7A is a top view of the laser oscillator in Embodiment 2 when a light-emitting element is completed. FIG. 7B is a cross-sectional view taken along the line A-A' of FIG. 7A. As shown in FIGS. 7A and 7B, electroluminescent layers 605a to 605c corresponding to three colors of red (R), green (G), and blue (B) are formed to overlap the plurality of concaves 600 over the anode 604. The electroluminescent layers 605a to 605c are formed separately in FIG. 7A. Alternatively, the electroluminescent layers 605a to 605c may be formed so as to be overlapped partly with one another. Over the electroluminescent layers 605a to 605c, a cathode 606 is formed to overlap the plurality of concaves 600.

In this embodiment, the arbitrary cathode 606 partly overlaps all of each anode 604. The overlapping portion serves as a light-emitting element 607. The light-emitting elements 607 are each located in each of the concave portions 600. The reflective film 603 is formed to have transmittance of approximately from 5 to 70% so that light generated in the electroluminescent layers 605a to 605c is oscillated between the reflective film 603 and the cathode 606, each of which serves as a reflector, to be emitted from reflective film 603. The laser light transmitted from the reflective film 603 is reflected by the concave portion 600 of the first layer 601 to increase directivity. The laser oscillator of this embodiment can emit laser light from the selected light-emitting element 607 by controlling voltage applied to the anode 604 and the cathode 606, similarly to a passive matrix light-emitting device.

In this embodiment, the concave portion 600 is formed to be closer to the anode 604 than the cathode 606. Alternatively, the concave portion 600 may be formed to be closer to the cathode 606 than the anode 604. In this instance, the anode 604 serves as the reflector and thus, is needed to be formed from a light-reflective material.

In this embodiment, the concave portion that reflects laser light and enhances the directivity is provided to overlap the light emitting element. Alternatively, the convex portion that refract light and enhances the directivity may be provided to overlap the light emitting element. Further, the concave portion and the convex portion may be both provided.

In Addition, a laser oscillator according to this embodiment may be used as a display device. Moreover, the laser oscillator according to this embodiment may be used as an active matrix display device by providing with driving elements to each of light emitting elements. The display device equipped with the laser oscillator according to this embodiment includes a projector and the like.

The electroluminescent layers for R, G and B are provided in this embodiment, but in the case of a monochrome display, one electroluminescent layer may be employed.

Embodiment 3

Figure 8:
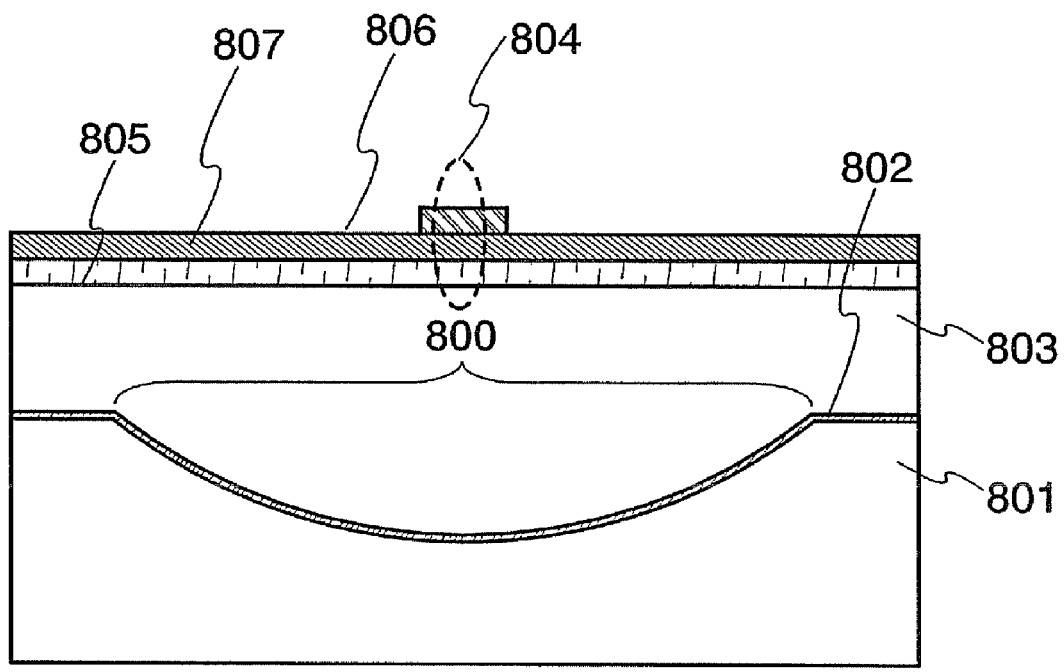
FIG. 8 is a cross-sectional view of a laser oscillator according to one aspect of the present invention.

One mode of a laser oscillator shown in FIG. 8 in which a reflective film that can reflect light is formed between a first layer and a second layer is explained in Embodiment 3.

FIG. 8 is a cross-sectional view of the laser oscillator of this embodiment. In the laser oscillator of this embodiment as shown in FIG. 8, a reflective film 802 is formed on a first layer 801 having a concave portion 800. The reflective film 802 can be formed by a material that can reflect light by vapor deposition. As the material for the reflective film 802, a material containing one or a plurality of metal elements such as Al, Ag, Ti, W, Pt, or Cr can be used. The reflective film 802 can be formed by a vapor deposition method. A material for the reflective film is not limited to the foregoing materials. Any material can be used as long as it can reflect light. For example, the reflective film may be formed by stacking a plurality of insulating films, each of which has different refractive indexes, such as a silicon oxide film, a silicon nitride film, and a titanium oxide film.

A second layer 803 is formed to cover the reflective film 802. The second layer 803 is light-transmitting and has a thickness enough to fill the concave portion 800. Different from the mode of FIGS. 1A and 1B, the refractive index of the first layer 801 is not always necessary to be lower than that of the second layer 803 since emitted laser light is reflected by the reflective film 802 in the laser oscillator in this embodiment. Further, each of the first layer 801 and the second layer 803 is formed by a single layer in FIG. 8, but each of the layers may be formed by a plurality of layers.

A light-emitting element 804 is formed over the second layer 803 to overlap the concave portion 800. The light-emitting element 804 includes two electrodes 805 and 806, and an electroluminescent layer 807 interposed between the two electrodes 805 and 806. One of the electrodes 805 and 806 is an anode, and the other is a cathode. FIG. 8 shows an example that the electrode 805 serves as an anode and the electrode 806 serves as a cathode. Alternatively, the electrode 805 may serve as a cathode and the electrode 806 may serve as an anode. Current is supplied to the electroluminescent layer 807 by applying a forward bias voltage to the electrodes 805 and 806, thereby making the electroluminescent layer 807 emit light.

The first layer 801 has a curved surface in the concave portion 800. The center of curvature of the curved surface is on the light emitting element 804 side, that is, a distance of the first layer 801 to the center of curvature is longer than that of the first layer 801 to the light emitting element 804.

The laser oscillator shown in FIG. 8 is provided with an optical resonator that is formed by the electrodes 805 and 806 of the light-emitting element 804. Light emitted from the electroluminescent layer 807 is oscillated by the electrodes 805 and 806 to be emitted as laser light. The optical resonator is formed so that an optical axis of the emitted laser light intersects with the second layer 803 and the emitted laser light is directed to the first layer 801.

Embodiment 4

Figure 9A:
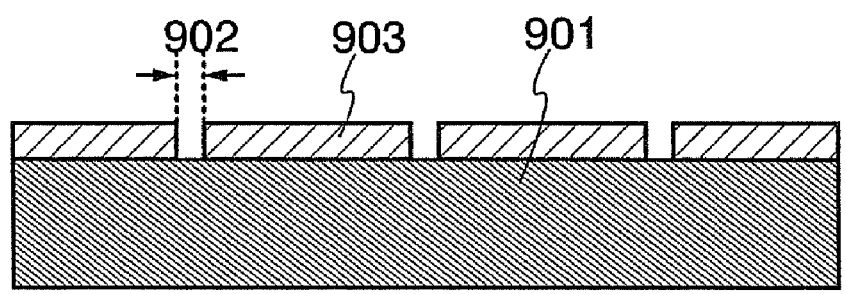
FIGS. 9A to 9C each show an embodiment for a method for manufacturing a concave portion.

A method for manufacturing a concave portion that reflects laser light is explained in Embodiment 4. As shown in FIG. 9A, a first layer 901 that is afterward provided with a concave portion is formed. The first layer 901 may be a glass substrate, a quartz substrate, a plastic substrate or the like; a resin film or an insulating film, each of which is deposited on the foregoing substrate. Then, a mask 903 with an opening portion 902 is formed on the first layer 901.

Figure 9B:
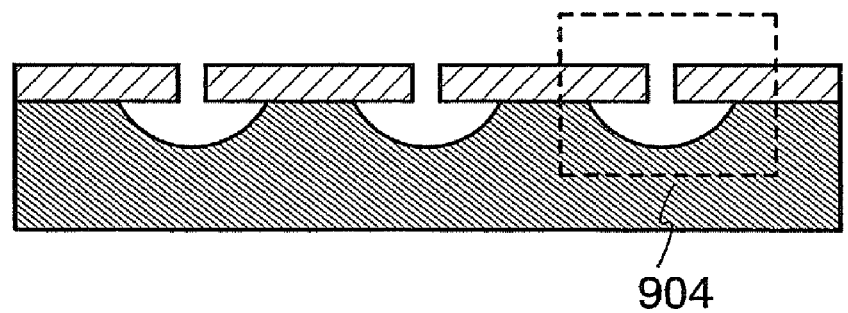

As shown in FIG. 9B, the first layer 901 is wet-etched at the opening portion 902 of the mask 903. The wet-etching is carried out by using an etchant that is selected appropriately depending on the material of the first layer 901. For example, hydrofluoric acid is used as the etchant in the case where glass is used as the first layer 901. An opening portion 904 with a curved surface can be provided in the first layer 901 by isotropic wet-etching.

Figure 9C:
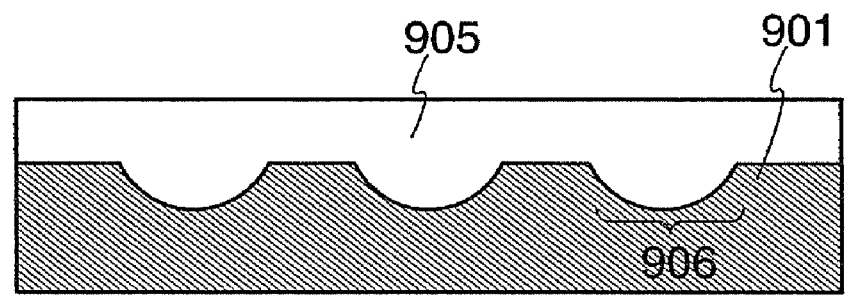

As shown in FIG. 9C, the concave portion 906 is left in the opening portion 904 when the mask on the first layer 901 is removed. A second layer 905 is formed on the first layer 901 provided with the opening portion 904. The second layer 905 is formed by a material having light-transmitting properties to have a thickness enough to fill the concave portion 906. The second layer 905 is formed by a material that has higher refractive index than that of the first layer 901, for example, transition metal oxides, nitrides, or the like can be used in the case where the first layer 901 is mad of glass.

Although the second layer 905 is formed on the first layer 901 in Embodiment 4, a reflective film that can reflect laser light may be formed between the first layer 901 and the second layer 905. In this instance, the second layer 905 may be light-transmitting, and is not required to be formed by a material that has higher refractive index than that of the first layer 901.

In the present invention, a method for manufacturing the first layer is not limited to that explained in this embodiment.

Embodiment 5

A method for providing a convex portion in a second layer and providing a concave portion in a first layer by using the convex portion is explained in Embodiment 5.

Figure 10A:
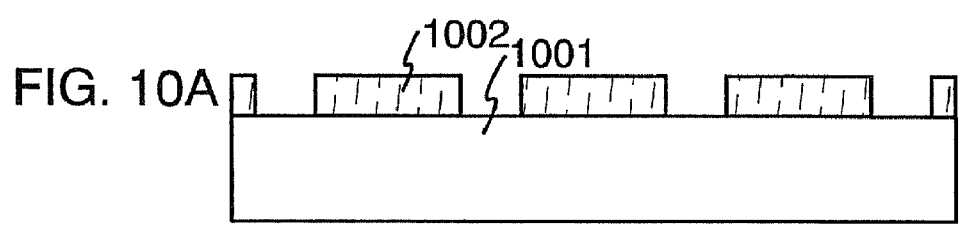
FIGS. 10A to 10F each show an embodiment for a method for manufacturing a concave portion.

As shown in FIG. 10A, resin 1002 is formed, which can be melted by heating over a second layer 1001 that is afterward provided with a convex portion. The resin 1002 is patterned to have an island-like shape. The second layer 1001 can be a glass substrate, a quartz substrate, a plastic substrate, or the like.

Figure 10B:
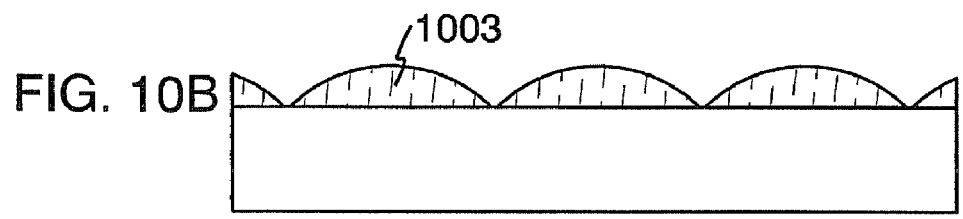

As shown in FIG. 10B, the resin 1002 that is pattered into an island-like shape is melted by heating so that its edge portion has a curved surface. By melting the resin 1002, resin 1003 having a curved surface is formed.

Figure 10C:
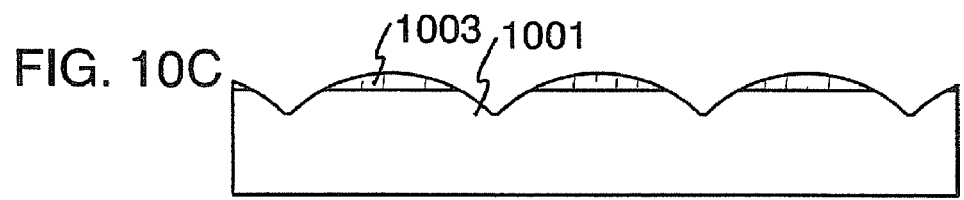
Figure 10D:
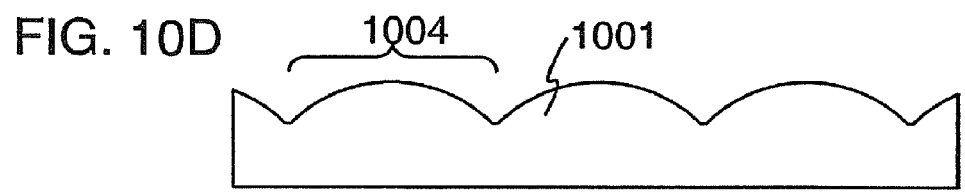

As shown in FIG. 10C, the second layer 1001 is dry-etched by using the resin 1003 as a mask. The dry-etching is carried out by using an etching gas selected appropriately depending on the material of the second layer 1001. For example, a fluorine gas or a chlorine gas such as $CF_4$, $CHF_3$, $Cl_2$, or the like can be used as the etching gas in the case that the second layer 1001 is made of glass. By the dry-etching, the resin 1003 is etched together as shown in FIG. 10C. Lastly, a convex portion 1004 can be formed in the second layer 1001 depending on the shape of the resin 1003 with a curved surface as shown in FIG. 10D.

Figure 10E:
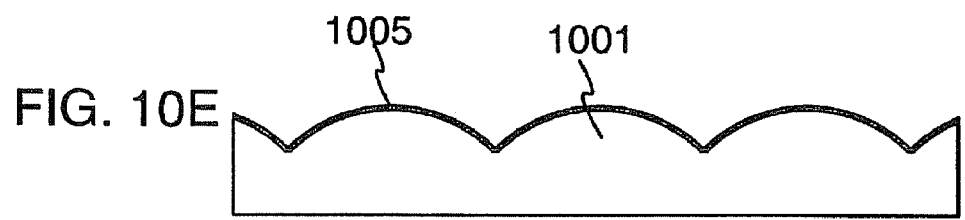
Figure 10F:
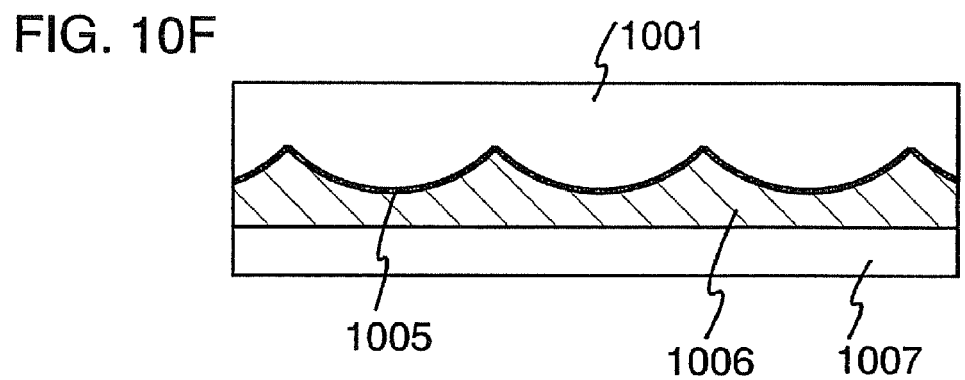

As shown in FIG. 10E, a reflective film 1005 that can reflects laser light is formed over the convex portion 1004 of the second layer 1001. Then, as shown in FIG. 10F, an adhesive agent 1006 that serves as a first layer is coated on the reflective film 1005 to be adhered with a substrate 1007. According to the structure, a concave portion can be provided to the adhesive agent 1006 that serves as the first layer.

The reflective film 1005 is formed in order to reflect laser light in Embodiment 5. However, laser light may be reflected by utilizing the difference of the refractive index between the second layer 1001 and the adhesive agent 1006 that serves as the first layer. In this case, the refractive index of the adhesive agent 1006 is made lower than that of the second layer 1001.

Embodiment 6

One mode of an electronic device including a laser oscillator according to the present invention is explained in Embodiment 6.

Figure 12A:
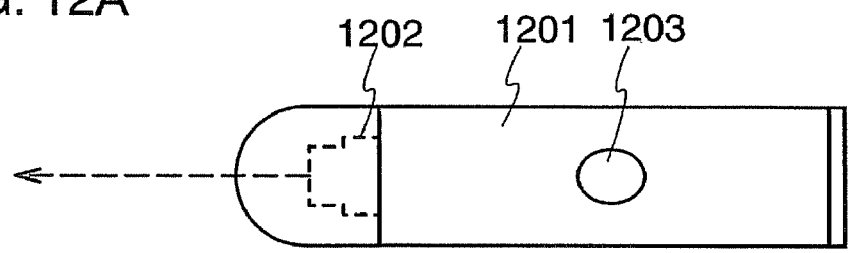
FIGS. 12A to 12C each show a structure of a laser pointer employing a laser oscillator according to one aspect of the present invention.

FIG. 12A is an external view of a laser pointer including a laser oscillator of the present invention. Reference numeral 1201 denotes a main body of the laser pointer, and reference numeral 1202 denotes a package provided with the laser oscillator therein. Internal of the main body 1201 is provided with a battery or the like for supplying electric power to the package 1202. Reference numeral 1203 denotes a switch for controlling the application of power.

Figure 12B:
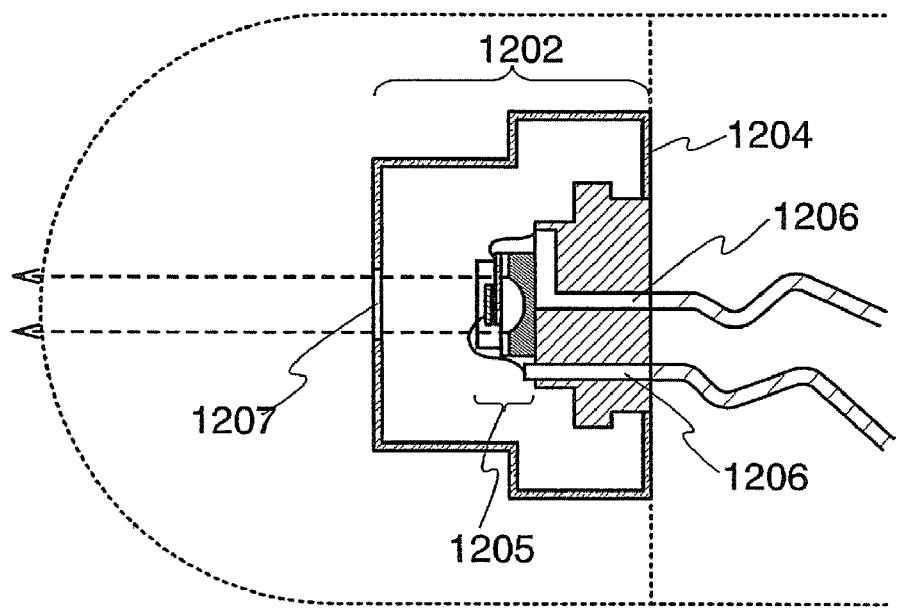

FIG. 12B is an enlarged view of the package 1202. A laser oscillator 1205 is provided in a housing 1204 to shield unnecessary radiation of laser light. A part of the housing 1204 is provided with a light-transmitting window 1207 to emit laser light from the laser oscillator 1205. The laser oscillator 1205 can be supplied with current from the battery installed inside the main body 1201 via a lead 1206.

Figure 12C:
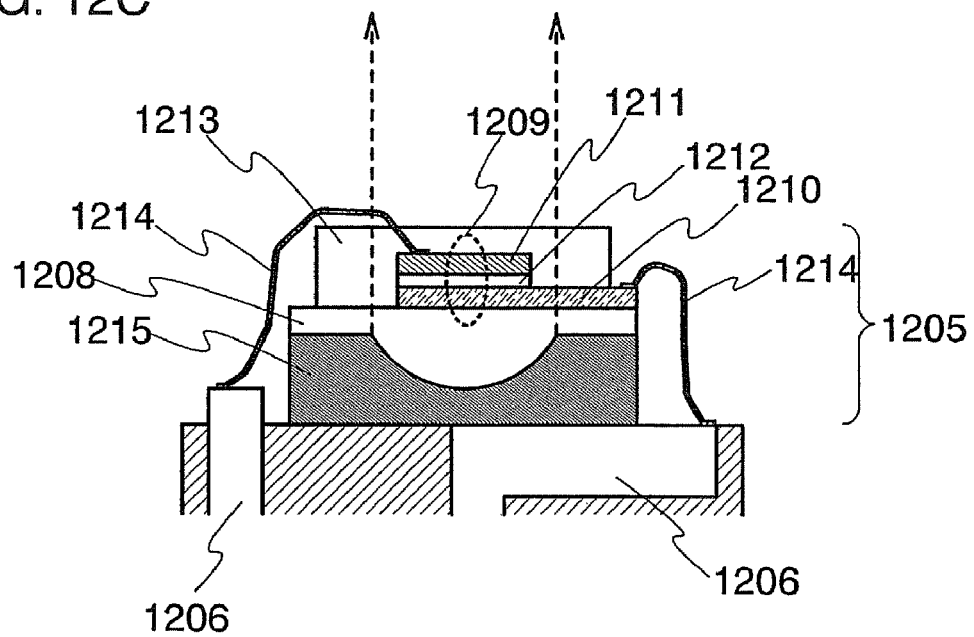

FIG. 12C is an enlarged view of the laser oscillator 1205. The laser oscillator 1205 includes a first layer 1215 with a concave portion, a second layer 1208 formed on the first layer 1215 so as to fill the concave portion, and a light-emitting element 1209 formed on the second layer 1208. The light-emitting element 1209 includes two electrodes 1210 and 1211, and an electroluminescent layer 1212 interposed between the two electrodes 1210 and 1211. The two electrodes 1210 and 1211 are electrically connected to a lead 1206 by a wire 1214. Reference numeral 1213 corresponds to resin for sealing the electroluminescent layer 1212. The resin 1213 can prevent the electroluminescent layer 1212 from being deteriorated due to moisture, oxygen, or the like.

Light is generated when current is supplied to the electroluminescent layer 1212 by applying a forward bias voltage to the electrodes 1210 and 1211 via the lead 1206. Then, the light generated in the electroluminescent layer 1212 is oscillated between the electrodes 1210 and 1211, and then, the laser light is emitted from the electrode 1210 side. The emitted laser light is reflected by the concave portion of the first layer 1215 to enhance the directivity and advances toward the light emitting element 1209 side as shown by the arrows of broken lines.

According to the present invention, the directivity of laser light emitted from the light emitting element 1209 can be enhanced by the concave portion of the first layer 1215 for supporting the light emitting element 1209. A part of the first layer 1215 serves as an optical system, and thus, resistance to a physical impact of electronic devices can be enhanced, which is different from the case of providing an optical system separately.

The laser oscillator having the structure illustrated in FIGS. 1A and 1B is employed in this embodiment; however, this embodiment is not limited to the structure. The laser oscillator shown in FIGS. 3A and 3B that enhances the directivity by refracting laser light in a convex portion may be used. The laser oscillator shown in FIG. 8 that is provided with the reflective film in a concave portion of a first layer may be used. The laser oscillator shown in FIGS. 4A and 4B that can converge laser light by using both of a concave portion and a convex portion may be used. Further, the laser oscillator shown in FIGS. 7A and 7B including a plurality of light-emitting elements formed in passive matrix form may be used.

Embodiment 7

A structure of a light-emitting element used for a laser oscillator of the present invention is explained in Embodiment 7.

Figure 13:
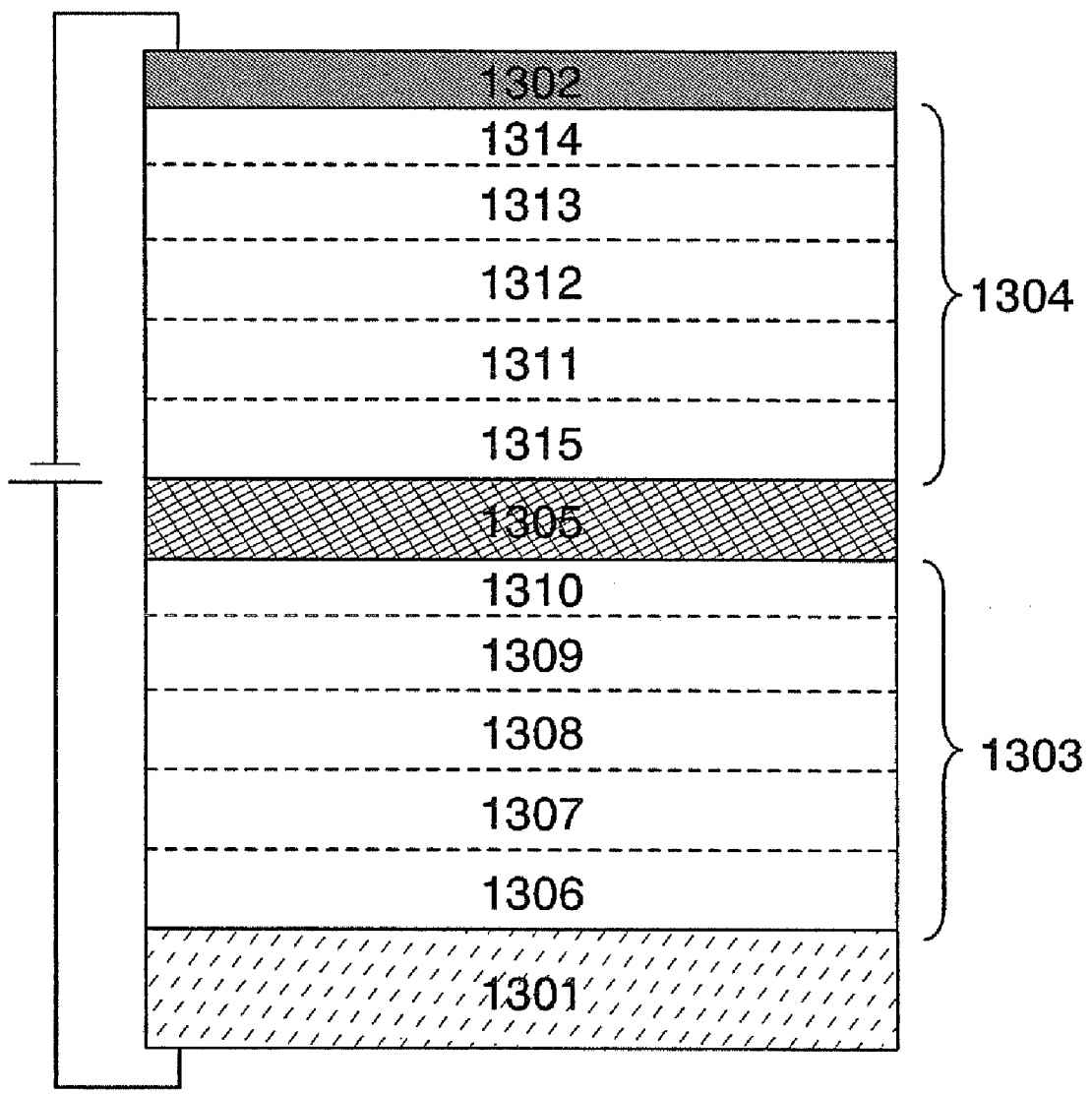
FIG. 13 shows a structure of a light-emitting element included in a laser oscillator according to one aspect of the present invention.

FIG. 13 shows one mode of a structure of a light-emitting element of the present invention. The light-emitting element shown in FIG. 13 has a structure including two electroluminescent layers 1303 and 1304 interposed between an anode 1301 and a cathode 1302. Further, the light-emitting element shown in FIG. 13 includes a charge generation layer 1305, which is a floating electrode that is not connected to an external circuit, between the two electroluminescent layers 1303 and 1304. The electroluminescent layer 1303 is formed by sequentially stacking a hole injecting layer 1306, a hole transporting layer 1307, a light-emitting layer 1308, an electron transporting layer 1309, and an electron injecting layer 1310 over the anode 1301. Further, the electroluminescent layer 1304 is formed by sequentially stacking a hole injecting layer 1315, a hole transporting layer 1311, a light-emitting layer 1312, an electron transporting layer 1313, and an electron injecting layer 1314 over the charge generation layer 1305.

The light-emitting element used for the laser oscillator of the present invention may include at least a light-emitting layer in each electroluminescent layer. Layers having properties other than light emission (a hole injecting layer, a hole transporting layer, an electron transporting layer, and an electron injecting layer) may be appropriately used with the light-emitting layer. The materials that can be used for the layers are recited in Embodiment 1. Note that the materials that can be used in the present invention are not limited to those described in Embodiment 1.

When a forward bias voltage is applied to the anode 1301 and the cathode 1302 of the light-emitting element shown in FIG. 13, a hole and an electron are injected to the electroluminescent layers 1303 and 1304, respectively. Then, the recombination of carriers is carried out in each of the electroluminescent layers 1303 and 1304 to emit light. Accordingly, in the case where the distance between the anode 1301 and the cathode 1302 is constant, energy of light emission to be obtained at the same amount of current becomes higher than in the case where a light-emitting element includes only one electroluminescent layer. Therefore, emission efficiency of laser light can be improved.

The charge generation layer 1305 may be formed by a material that can transmit light. For example, an ITO, a mixture of, $V_2O_5$ and an arylamine derivative; a mixture of $MoO_3$ and an arylamine derivative; a mixture of $V_2O_5$ and F4TCNQ (tetrafluoro tetrathiafulvalene); and the like can be used.

When the anode 1301 and the cathode 1302 are used as reflectors, materials or thickness thereof are selected so that the reflectance of one of these electrodes is as high as possible and the transmittance of the other electrode is approximately 5 to 70%. In the case where a reflector is formed separately, the anode 1301 or cathode 1302 comprise such a material that the light is passed through. Further, the distance between reflectors is an integral multiple of a half of the wavelength λ to be oscillated. A lamination structure of a light-emitting element is designed, so that light reflected by a reflector and a phase of newly generated light are correspondent.

Embodiment 8

A shape of a concave portion of the laser oscillator of the present invention is described in Embodiment 8.

Figure 14:
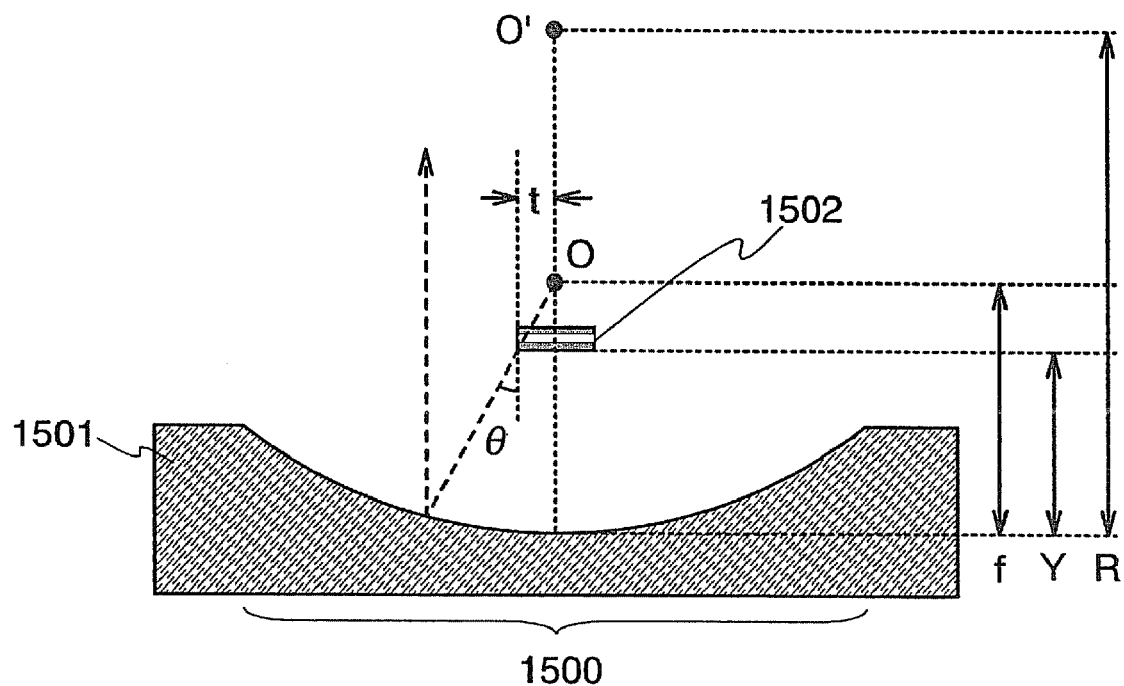
FIG. 14 shows a positional relationship of a laser light-source and a concave portion.

FIG. 14 shows a positional relationship of a layer 1501 (a reflective film, here) having a concave portion 1500 to reflect light and a laser light-source 1502. The laser light-source 1502 includes an optical resonator and a laser medium, in which laser light is emitted toward the concave portion 1500 from the laser light-source 1502. The concave portion 1500 has a center of curvature O' on the laser light-source 1502 side.

The laser light-source 1502 is a surface light-source having a certain degree of area enough to emit laser light. The laser light emitted from the surface light-source has a divergence angle θ. Herein, it is supposed that a point light-source having a divergence angle θ is located at a focal point O and light emitted from the laser light-source 1502 diverges similarly to light emitted from the point light-source. In this case, the highest directivity of the laser light which is reflected by the concave portion 1500 can be obtained by adjusting the focal point O on the center of curvature O' side of the concave portion 1500 to the point light-source.

Therefore, the focus length of the concave portion 1500 is denoted by f, the width of the laser light-source 1502 is denoted by 2t, and the distance between the laser light-source 1502 and the concave portion 1500 is denoted by Y. When the relation of the divergence angle θ and the focus length f is expressed by the next equation (Equation 1), it is considered that the highest directivity of laser light reflected by the concave portion 1500 can be obtained at this time.

$$f = Y + t\sqrt{\frac{1}{\sin^2\theta} - 1} \quad \text{(Equation 1)}$$

Note that the focus length f is equivalent to a half of the radius of curvature R, and thus, the next equation (equation 2) can be obtained from the equation 1.

$$R = 2 \times \left(Y + t\sqrt{\frac{1}{\sin^2\theta} - 1}\right) \quad \text{(Equation 2)}$$

The shape of the concave portion 1500 can be optically designed to enhance the directivity of laser light by using Equation 1 or Equation 2.

In Addition, a laser oscillator according to the invention may be used as a display device. The display device equipped with the laser oscillator includes a projector, LCD (Liquid crystal display), using the laser oscillator as a backlight, and the like. Specifically, in the case of FS-LCD (Field sequential LCD), a light emitting element shown in embodiment 2 that has electroluminescent layers corresponding to each of R, G and B may be used. As an example of the FS-LCD, the entire disclosure of US Patent 2003/0058210 is incorporated herein by reference.

This application is based on Japanese Patent Application serial no. 2003-322287 filed in Japan Patent Office on Sep. 12, 2003, the contents of which are hereby incorporated by reference.

Although the present invention has been fully described by way of Embodiment Mode and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A laser oscillator comprising:
   a light emitting element over a first layer comprising a concave portion;
   a second layer that is light-transmitting and that is formed to cover the light emitting element; and
   a third layer between the first layer and the light emitting element,
   wherein the light emitting element comprises:
   a first electrode over the first layer;
   a first organic electroluminescent layer over the first electrode;
   a second organic electroluminescent layer over the first organic electroluminescent layer;
   a charge generation layer between the first and second organic electroluminescent layers; and
   a second electrode over the second organic electroluminescent layer,
   wherein a first refractive index of the first layer is lower than a second refractive index of the third layer,
   wherein first light generated in the first organic electroluminescent layer and second light generated in the second organic electroluminescent layer are reflected at the first electrode and the second electrode, and
   wherein the concave portion has a curve.

2. The laser oscillator according to claim 1, wherein the charge generation layer comprises molybdenum oxide.

3. The laser oscillator according to claim 1, wherein a distance between the first and second electrodes is an integral multiple of a half of a wavelength of the light.

4. The laser oscillator according to claim 1, wherein the first layer is an insulating substrate.

5. A laser oscillator comprising:
   a light emitting element over a first layer comprising a concave portion;
   a second layer that is light-transmitting and that is formed to cover the light emitting element; and
   a third layer between the first layer and the light emitting element,
   wherein the light emitting element comprises:
   a first electrode over the first layer;
   a first organic electroluminescent layer over the first electrode;
   a second organic electroluminescent layer over the first organic electroluminescent layer;
   a charge generation layer between the first and second organic electroluminescent layers; and
   a second electrode over the second organic electroluminescent layer,
   wherein the second layer has a curved convex portion which overlaps with the light emitting element,
   wherein a first refractive index of the first layer is lower than a second refractive index of the third layer,
   wherein first light generated in the first organic electroluminescent layer and second light generated in the second organic electroluminescent layer are reflected at the first electrode and the second electrode, and
   wherein the concave portion has a curve.

6. The laser oscillator according to claim 5, wherein the charge generation layer comprises molybdenum oxide.

7. The laser oscillator according to claim 5, wherein a distance between the first and second electrodes is an integral multiple of a half of a wavelength of the light.

8. The laser oscillator according to claim 5, wherein the second layer comprises polymeric material.

9. The laser oscillator according to claim 5, wherein the first layer is an insulating substrate.

10. A laser oscillator comprising:
   a reflective film over a first layer comprising a concave portion;
   a light emitting element over the reflective film;
   a third layer between the reflective film and the light emitting element; and
   a second layer that is light-transmitting and that is formed to cover the light emitting element,
   wherein the light emitting element comprises:
   a first electrode over the first layer;
   a first organic electroluminescent layer over the first electrode;
   a second organic electroluminescent layer over the first organic electroluminescent layer;
   a charge generation layer between the first and second organic electroluminescent layers; and a second electrode over the second organic electroluminescent layer, wherein the second layer has a curved convex portion which overlaps with the light emitting element, wherein a first refractive index of the first layer is lower than a second refractive index of the third layer, wherein first light generated in the first organic electroluminescent layer and second light generated in the second organic electroluminescent layer are reflected at the first electrode and the second electrode, and wherein the concave portion has a curve.

11. The laser oscillator according to claim 10, wherein the charge generation layer comprises molybdenum oxide.

12. The laser oscillator according to claim 10, wherein a distance between the first and second electrodes is an integral multiple of a half of a wavelength of the light.

13. The laser oscillator according to claim 10, wherein the second layer comprises polymeric material.

14. The laser oscillator according to claim 10, wherein the first layer is an insulating substrate.

* * * * *